United States Patent
Becker et al.

(10) Patent No.: US 9,562,936 B2
(45) Date of Patent: Feb. 7, 2017

(54) INFRARED DETECTION DEVICE AND METHOD

(71) Applicant: COMMISSARIAT A L'ENERGIE ATOMIQUE ET AUX ENE ALT, Paris (FR)

(72) Inventors: Sebastien Becker, Voiron (FR); Antoine Hamelin, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 22 days.

(21) Appl. No.: 14/584,239

(22) Filed: Dec. 29, 2014

(65) Prior Publication Data
US 2015/0192628 A1    Jul. 9, 2015

(30) Foreign Application Priority Data
Jan. 8, 2014 (FR) ..................... 14 00025

(51) Int. Cl.
G01J 5/20 (2006.01)
G01J 5/22 (2006.01)
G01R 27/02 (2006.01)

(52) U.S. Cl.
CPC ................. *G01R 27/02* (2013.01); *G01J 5/20* (2013.01); *G01J 5/22* (2013.01)

(58) Field of Classification Search
CPC .................. G01J 5/02; G01J 5/24; G01J 5/20; G01J 5/22
See application file for complete search history.

(56) References Cited

U.S. PATENT DOCUMENTS

| | | | | |
|---|---|---|---|---|
| 5,952,659 A | * | 9/1999 | Yoneyama | G01J 5/20 250/332 |
| 2010/0181485 A1 | | 7/2010 | Legras | |

FOREIGN PATENT DOCUMENTS

| | | |
|---|---|---|
| EP | 2 071 309 A1 | 6/2009 |
| EP | 2 071 310 A1 | 6/2009 |
| EP | 2 163 871 A1 | 3/2010 |
| EP | 2 208 976 A1 | 7/2010 |
| WO | WO 2010/125281 A1 | 11/2010 |

OTHER PUBLICATIONS

French Preliminary Search Report issued Jul. 22, 2014, in French Application No. 14 00025 filed Jan. 8, 2014 (with English Translation of Categories of Cited Documents).

* cited by examiner

*Primary Examiner* — David Porta
*Assistant Examiner* — Faye Boosalis
(74) *Attorney, Agent, or Firm* — Oblon, McClelland, Maier & Neustadt, L.L.P.

(57) ABSTRACT

Infrared detection device comprising at least one first bolometer able to detect at least a part of infrared radiation intended to be received by the infrared detection device, and a reading and compensation circuit of a first electrical signal intended to be outputted by the first bolometer, with the reading and compensation circuit comprising at least:
  one second bolometer coupled electrically to the first bolometer and insensitive to the infrared radiation intended to be received by the infrared detection device;
  one first reading circuit of said first electrical signal from which is subtracted a second electrical signal intended to be outputted by the second bolometer;
  one second reading circuit of an electrical voltage at the terminals of the first bolometer and/or of an electrical voltage at the terminals of the second bolometer, comprising a plurality of switches.

7 Claims, 3 Drawing Sheets

INFRARED DETECTION DEVICE AND METHOD

TECHNICAL FIELD

The invention relates to a bolometer detection, or infrared imaging, device and comprising a pixel reading circuit able to compensate for the thermal disturbances that the pixels are subjected to and which makes it possible to electrically characterise at least one sensitive bolometer of the reading circuit.

PRIOR ART

A bolometric infrared detection device is a device capable of operating at ambient temperature, and comprising a pixel array wherein each pixel comprises a bolometer. Each bolometer comprises a material of which the electrical resistivity varies according to a heating caused by incident infrared radiation. The variations in the electrical resistivity of the material sensitive to the temperature of the bolometers are measured via the variations in the current induced by the exposure of the bolometers to a scene, with the polarization at the terminals of the bolometer being fixed. These variations in the current are directly proportional to the variations of the electrical resistances of the bolometers, and are themselves linked to the variations in temperature that the sensitive material of the bolometers is subjected to when they are exposed to the light coming from the observed scene.

However, the very low relative variation in the electrical resistance of the bolometers during the observation of a scene renders the measuring of the local variations in temperature of this scene very delicate by such bolometers. In order to overcome most of the unhelpful signal, so-called "compensation", or "baselining", or "reference" bolometers are generally used. These bolometers are insensitive to the incident optical flow received by the bolometers of the pixels and coming from the observed scene. They are conventionally thermally linked to the substrate or they can also be mechanically screened. The reading circuit making it possible to read currents outputted by the bolometers of the pixels is in this case designed such that the currents generated through the compensation bolometers are subtracted from the currents coming from the bolometers sensitive to the incident optical flow. In this way, most of the common-mode current is eliminated during the reading of the currents outputted by the bolometers sensitive to the incident optical flow. Such a configuration is for example described in document EP 2 208 976 A1.

On the other hand, fluctuations in the temperature of the substrate produce an unhelpful signal that is unfavourable in detecting the useful signal coming from the observed scene and that is sought to be measured. In order to limit this effect, the substrate is generally regulated thermally.

Such compensation structures are generally positioned in each column foot of the pixel array, as shown in FIG. 1. In this figure, a pixel 10 of a pixel array of an infrared detection device is shown and comprises a bolometer 12 sensitive to an optical flow received by the pixel array and connected on one side to a first electric potential VDET of a supply voltage and on the other side to the source of a first injection MOS transistor 14, here of the PMOS type. The pixels of the column of the matrix to which the pixel 10 belongs are all connected to the same reading and compensation circuit 15 comprising a compensation bolometer 16 connected on one side to a second electric potential VSK of the supply voltage and on the other side to the source of a second injection MOS transistor 18, here of the NMOS type.

Alternatively, there can be several compensation pixels per column connected in series and/or in parallel in relation to one another. It is also possible to have a reference bolometer arranged at the head of each line of the pixel array in place of the compensation bolometer arranged at the column foot. In this case, via a set of current mirrors, the current flowing in the reference bolometer is copied and subtracted from the currents coming from the bolometers sensitive to the incident optical flow.

The reading of the information outputted by the bolometers of the pixels of the matrix is done sequentially line-by-line by successively connecting the bolometers of the pixels to the associated reading and compensation circuit, as the reading of the different lines takes place, each bolometer sensitive to the incident optical flow is therefore compensated by the same compensation bolometer associated with the column to which the bolometer read belongs. A useful current $di = I_{sens} - I_{comp}$, with $I_{sens}$ corresponding to the current passing through the bolometer 12 and $I_{comp}$ corresponding to the compensation current passing through the compensation bolometer 16, is integrated into a capacitor 22 coupled to an operational amplifier 20 mounted as an integrator, and forming a capacitive transimpedance amplifier (CTIA), also located at the column foot, in the reading and compensation circuit 15, during a predetermined integration time T. The output of the amplifier 20 is looped back on the non-inverting input of the operational amplifier 20 via the capacitor 22. A switch 24 connected in parallel to the capacitor 22 makes it possible to reinitialise the capacitor 22 during the reading of the information supplied by the pixel of the preceding line. A bias voltage $V_{bus}$ of the operational amplifier 20 is applied to its inverting input.

During the turning on of the circuit of FIG. 1, the bias voltages applied to the gates of the MOS transistors 14 and 18 are generally chosen so that in the presence of a uniform scene (for example when the system is cut off optically), the useful current di is substantially zero for all of the pixels of the matrix, i.e. such that the current $I_{sens}$ is substantially equal to the current $I_{comp}$. As the performance of the detector (response and temporal noise, etc.) depends on the current flowing in the sensitive bolometer ($I_{sens}$), the polarization of the bolometric bridge (formed of the sensitive bolometer, the associated compensation bolometer and MOS transistors associated with these two bolometers), i.e. the bias voltages applied to the gates of the MOS transistors 14 and 18, is chosen to obtain nominal performance.

Indeed, up to a certain value of the bias current, the performance of the detector, expressed by the NETD ("Noise Equivalent Temperature Difference", or relationship between the temporal noise and the response of the detector) is improved. This phenomenon stems from the fact that the response of the detector improves faster than the noise does. Beyond this value, the noise and the response change symmetrically, and there is therefore no further gain in terms of performance. If the bias current increases again, the performance becomes limited by the reading circuit, and in particular the CTIA, which itself becomes a source of noise. Performance is then degraded. The objective is therefore to place the detector in the configuration wherein its performance is nominal, i.e. on the plate where the noise and the response change symmetrically.

On the other hand, the exact knowledge of the current flowing in the sensitive bolometers has an importance in simulating the performance of the detectors as it is an input parameter of the digital models. This parameter is usually difficult to access as it depends in particular on the technological variability of the threshold voltages of the MOS transistors used. The performance of the pixel such that the temporal noise and the response for example, can be simulated digitally using technological parameters of the pixel such as the design, the material parameters (such as the noise coefficient Kf in 1/f, the TCR coefficient of thermal variation of the resistance of the bolometer, etc.); to which it is suitable to add the current flowing in the sensitive bolometer ($I_{sens}$). This current is generally estimated by measuring the consumption of electrical power that supplies all of the bolometers of the matrix, and by dividing this electrical consumption measured by the number of columns of pixels that the pixel array comprises. This method however gives rise to a problem when the matrix has several defective pixels because in this case, the consumption of this electrical power can be affected by these faults (typically short circuits and open circuits). In addition, this method of measuring the current cannot be applied when the electrical power is used to electrically supply other components in addition to the bolometric bridges because in this case, the electrical consumption of this power is no longer imputable to the bolometric bridges.

On the other hand, from a technological integration standpoint, it is also important to know with precision the value of the electrical resistances of the sensitive bolometers and their dispersion. Conventionally, the resistance of the sensitive bolometer 12, called $R_{sens}$, is measured by placing the first injection MOS transistor 14 in a resistance regime and the second injection MOS transistor 18 in the blocked state ($I_{comp}=0$). The values of the current integrated by the operational amplifier 20 (respectively called $I_1$ and $I_2$, and corresponding to the values of the currents passing through the sensitive bolometer 12 and the first injection MOS transistor 14) for two values of VDET (called respectively $VDET_1$ and $VDET_2$) close to the bias voltage $V_{bus}$ of the operational amplifier 20 are then measured. The following is then obtained for the two measurements:

$$R_{sens} + r_{MOS} = \frac{VDET_1 - V_{bus}}{I_1} = \frac{VDET_2 - V_{bus}}{I_2} \quad (1)$$

$$R_{sens} \gg r_{MOS}$$

$$I_1 = \frac{C}{T}(V_{out1} - V_{bus})$$

$$I_2 = \frac{C}{T}(V_{out2} - V_{bus})$$

with $r_{MOS}$: electrical resistance of the first injection MOS transistor 14 in a resistance regime;

$V_{out1}$ and $V_{out2}$: voltages obtained at the output of the operational amplifier 20 respectively for the currents $I_1$ and $I_2$;

C: value of the electric capacitor 22.

The value of the resistance $R_{sens}$ of the sensitive bolometer 12 can therefore be estimated according to the equation:

$$R_{sens} \approx \frac{T}{C} \times \frac{VDET_2 - VDET_1}{V_{out1} - V_{out2}} \quad (2)$$

A similar method using a single value of VDET and two separate integration times also makes it possible to measure $R_{sens}$.

However, this method of estimating $R_{sens}$ cannot always be applied, in particular when the electric potential VDET cannot be modified or when it is difficult to implement this method with two separate integration times.

DESCRIPTION OF THE INVENTION

There is therefore a need to propose an infrared detection device, as well as a detection method, comprising a compensation structure and furthermore making it possible to calculate the electrical resistance of a sensitive bolometer and/or of a compensation bolometer as well as the current flowing in each bolometric bridge of the detection device independently of one another and independently of the electrical power of the device.

For this, an infrared detection device is proposed comprising at least one first bolometer able to detect at least one part of an infrared radiation intended to be received by the infrared detection device, and a reading and compensation circuit, or reading and compensation device, of a first electrical signal intended to be outputted by the first bolometer, with the reading and compensation circuit comprising at least:
 one second bolometer coupled electrically to the first bolometer and insensitive to the infrared radiation intended to be received by the infrared detection device;
 first reading means, or first reading circuit, of said first electrical signal from which is subtracted a second electrical signal intended to be outputted by the second bolometer;
 second reading means, or second reading circuit, of an electrical voltage at the terminals of the first bolometer and/or of an electrical voltage at the terminals of the second bolometer.

As such, the integration of the second reading means, or second reading circuit, of the electrical voltage at the terminals of the first bolometer within the reading and compensation circuit makes it possible to calculate, using the measurement of this tension, the electrical resistance of the first sensitive bolometer. Subject to knowing the value of the electrical resistance or resistances of the sensitive bolometers, the infrared detection device also makes it possible to know the current flowing in the sensitive bolometer or each of the sensitive bolometers of the detection device independently of one another. In addition, the integration of the second reading means, or second reading circuit, of the electrical voltage at the terminals of the second bolometer within the reading and compensation circuit can also make it possible to calculate, using the measurement of this tension, the electrical resistance of the second compensation bolometer or bolometers. Subject to knowing the value of the electrical resistance of the compensation bolometer or bolometers, the infrared detection device also makes it possible in this case to know the current flowing in the compensation bolometer or each of the compensation bolometers of the detection device independently of one another.

The infrared detection device therefore makes it possible to best adjust the polarization of the first and of the second bolometers in order to obtain nominal performance of the device and to develop with better precision the digital models simulating the operation and the performance of the pixels of the device. With respect to detection devices of prior art, the device described here makes it possible in particular to overcome the efficiency problems of the pixels on the matrix, for example in the case of defective pixels, which are able to distort the value of the electrical power consumption of the pixels.

The infrared detection device also makes it possible to measure the electrical resistances of the sensitive bolometer or bolometers and/or of the compensation bolometer or bolometers, and to calculate the current passing through the sensitive bolometer or bolometers and/or the compensation bolometer or bolometers without varying an electrical supply potential applied to the sensitive bolometer or bolometers and/or to the compensation bolometer or bolometers, and therefore to overcome problems of measuring when this electric potential cannot be modified (connected to the mass of the circuit for example or to the wells of the MOS transistors). In addition, for this measurement, when the first bolometer and the second bolometer are coupled electrically to MOS transistors making it possible to polarize these bolometers, the detection device makes it possible to overcome technological dispersions of the series resistors of these injection and biasing MOS transistors of the bolometric bridge. With respect to detection devices of prior art, the detection device therefore allows for an increase in the accuracy on the measurement of the electrical resistance of the sensitive bolometer or bolometers and/or of the compensation bolometer or bolometers, and this all the more so that this value is low.

The infrared detection device makes it possible to improve and to facilitate the measurement of the electrical resistances of the sensitive bolometer or bolometers and/or of the compensation bolometer or bolometers, regardless of the operating constraints of the reading and compensation circuit in terms of electrical power supply.

The infrared detection device may further comprise means of biasing, or a biasing circuit, the first bolometer and of the second bolometer. These biasing means may comprise at least one first MOS transistor coupled electrically to a terminal of the first bolometer and at least one second MOS transistor coupled electrically to a terminal of the second bolometer.

The first reading means, or first reading circuit, may comprise at least one first operational amplifier able to carry out an integration of a first current intended to pass through the first bolometer, corresponding to the first electrical signal, and from which is subtracted a second current, corresponding to the second electrical signal, intended to pass through the second bolometer.

The second reading means, or second reading circuit, may comprise at least one second operational amplifier mounted as a voltage follower and comprising an input connected electrically to one of the terminals of the first bolometer via a switch located in a pixel of the infrared detection device, with the pixel comprising the first bolometer, and/or connected electrically to one of the terminals of the second bolometer. When the first bolometer is part of a pixel of a pixel array of which the lines are read sequentially, the switch that makes it possible to read the voltage at the terminals of the first bolometer can be activated synchronously with an addressing signal of the line that comprises the first bolometer.

In this case, the second reading means, or second reading circuit, may further comprise means able to electrically connect an output of the infrared detection device with an output of the first reading means, or of the first reading circuit, or with an output of the second operational amplifier.

The second reading means, or second reading circuit, may comprise a plurality of switches able to electrically connect, in a first configuration, a first input of the first operational amplifier to an electrical connection that connects the first bolometer to the second bolometer, and to electrically connect, in a second configuration, a second input of the first operational amplifier to one of the terminals of the first bolometer via one of the switches located in a pixel of the infrared detection device, with the pixel comprising the first bolometer, and/or to one of the terminals of the second bolometer, and such that the first operational amplifier is mounted as an integrator in the first configuration or as a voltage follower in the second configuration. With regards to second reading means, or second reading circuit, comprising an additional operational amplifier, this alternative comprising second reading means, or second reading circuit, formed of switches simplifies the integration of at least one part of these second reading means, or second reading circuit, into a column foot of the matrix and/or directly into the pixels of the matrix thanks in particular to a gain in place of these switches with respect to an additional operational amplifier. The switches may be formed by MOS transistors, with the closed or open state of a switch corresponding in this case to the blocked or passing state of the MOS transistor.

In this alternative, the switches may be able to electrically connect, in the first configuration, the second input of the first operational amplifier to an electrical bias potential, and able to electrically connect, in the second configuration, said electrical connection to the electrical bias potential.

The infrared detection device may comprise a pixel array such that each pixel comprises at least one first bolometer able to detect a part of the infrared radiation intended to be received by the infrared detection device, and wherein each line or each column of pixels of the matrix is coupled electrically to a reading and compensation circuit comprising at least:
- one second bolometer electrically coupled to the first bolometers of said line or column of pixels and insensitive to the infrared radiation intended to be received by the infrared detection device;
- first reading means, or first reading circuit, of first electrical signal intended to be outputted by the first bolometers of said line or column of pixels from which is subtracted a second electrical signal intended to be outputted by the second bolometer;
- second reading means, or second reading circuit, of an electrical voltage at the terminals of the first bolometer via a switch located in the pixel and/or of an electrical voltage at the terminals of the second bolometer.

The second reading means, or the second reading circuit, may be able to read the electrical voltage at the terminals of the first bolometer via the switch located in the pixel and able to read the electrical voltage at the terminals of the second bolometer via a second switch located in the reading and compensation circuit.

The infrared detection device may be such that:
- the first bolometer may comprise a first terminal connected electrically to a first electric supply potential, and a second terminal connected electrically to the source of a first MOS transistor;
- the second bolometer may comprise a first terminal connected electrically to a first electrode of a second MOS transistor corresponding to the source of the second MOS transistor, and a second terminal connected electrically to a second electric supply potential;
- an input of the first reading means, or of the first reading circuit, may be connected electrically to a second electrode of the second MOS transistor corresponding to the drain of the second MOS transistor;

an input of the second reading means, or of the second reading circuit, may be connected electrically to the second terminal of the first bolometer via a switch located in the pixel and/or at the first terminal of the second bolometer.

An infrared detection method implemented using an infrared detection device such as described hereinabove is also proposed, that may comprise at least the steps of:

polarization of the first MOS transistor and of the second MOS transistor such that the first MOS transistor is in a resistance regime and that the second MOS transistor is in the blocked state, then integrating, during a duration T, of the current passing through the first bolometer in a capacitor of value C coupled to the first operational amplifier, then measurement of an output voltage $V_{out}$ of the first operational amplifier, then measurement, by the second reading means or by the second reading circuit, of a first electric potential $V_{S1}$ to the second terminal of the first bolometer, then calculation of an electrical resistance $R_{sens}$ of the first bolometer such that:

$$R_{sens} = \left| \frac{VDET - V_{S1}}{(V_{out} - V_{bus}) \times \frac{C}{T}} \right|,$$

with VDET: first electrical supply potential applied to the first terminal of the first bolometer;

$V_{bus}$: electrical bias potential applied to an input of the first operational amplifier;

and/or comprising at least the steps of:

polarization of the first MOS transistor and of the second MOS transistor such that the first MOS transistor is in blocked state and that the second MOS transistor is in a resistance regime, then integrating, during a duration T, of the current passing through the second bolometer in the capacitor of value C coupled to the first operational amplifier, then measurement of an output voltage $V_{out}$ of the first operational amplifier, then measurement, by the second reading means, or by the second reading circuit, of a first electric potential $V_{S1'}$ at the first terminal of the second bolometer, then calculation of an electrical resistance $R_{comp}$ of the second bolometer such that:

$$R_{comp} = \left| \frac{V_{SV} - VSK}{(V_{out} - V_{bus}) \times \frac{C}{T}} \right|,$$

with VSK: second electric supply potential applied to the second terminal of the second bolometer.

The infrared detection method may further comprise, when the step of calculating the electrical resistance $R_{sens}$ is implemented, the steps of:

polarization of the first MOS transistor and of the second MOS transistor such that a current passing through the first bolometer is substantially equal to a current passing through the second bolometer, then measurement, by the second reading means, or by the second reading circuit, of a second electric potential $V_{S2}$ at the second terminal of the first bolometer, then calculation of a current $I_{sens}$ passing through the first bolometer such that:

$$I_{sens} = \frac{VDET - V_{S2}}{R_{sens}},$$

and/or may further comprise, when the step of calculating the electrical resistance $R_{comp}$ is implemented, the steps of:

polarization of the first MOS transistor and of the second MOS transistor such as a current passing through the first bolometer is substantially equal to a current passing through the second bolometer, then measurement, by the second reading means, or by the second reading circuit, of a second electric potential $V_{S2'}$ at the first terminal of the second bolometer, then calculation of a current $I_{comp}$ passing through the second bolometer such that:

$$I_{comp} = \frac{V_{S2'} - VSK}{R_{comp}}.$$

BRIEF DESCRIPTION OF THE DRAWINGS

This invention shall be better understood when reading the description of embodiments given purely for the purposes of information and in no way restricted by making reference to the annexed drawings wherein.

Identical, similar or equivalent portions of the various figures described hereinafter bear the same numerical references in such a way as to facilitate passing from one figure to the other.

The various portions shown in the figures are not shown necessarily according to a uniform scale, in order to make the figures easier to read.

The various possibilities (alternatives and embodiments) must be understood as not being exclusive from one another and can be combined together.

DETAILED DESCRIPTION OF PARTICULAR EMBODIMENTS

Figure 2:
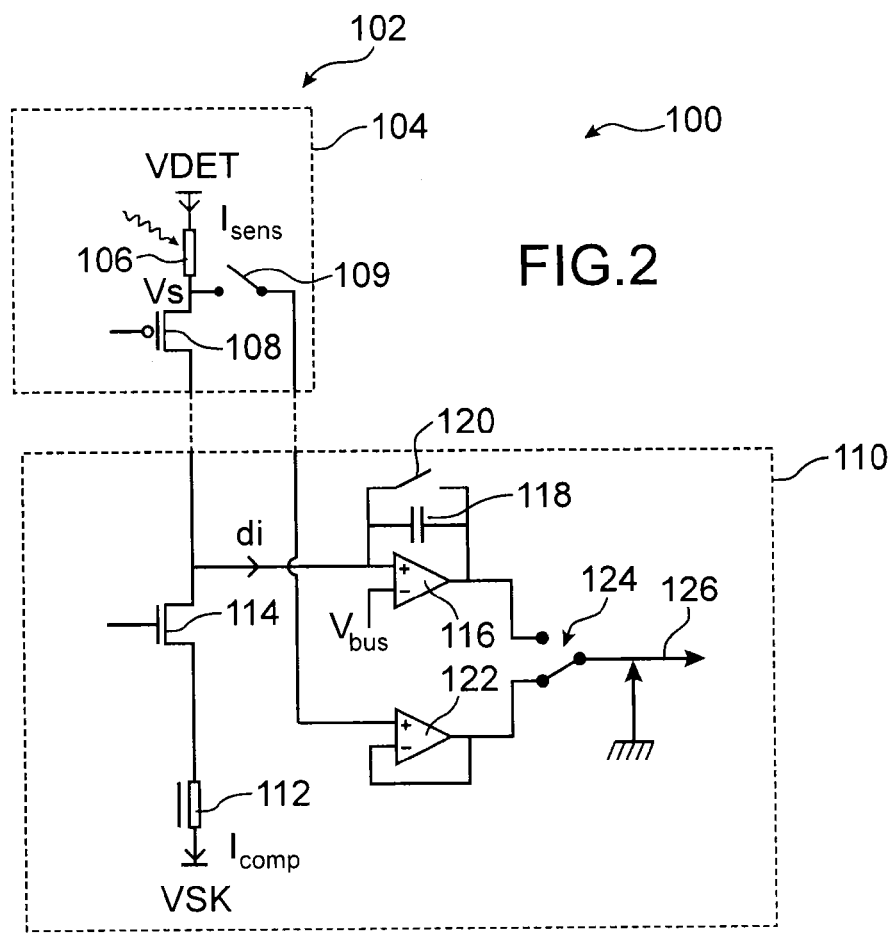
FIGS. 2 to 4 show a part of infrared detection devices according to first, second and third embodiments.

Reference is first made to FIG. 2 which shows an infrared detection device 100 according to a first embodiment.

The infrared detection device 100 comprises a pixel array 102. A single pixel 104 of this matrix 102 is shown in FIG. 2 and is for example similar to the pixel 10 described hereinabove in liaison with FIG. 1. The pixel 104 therefore comprises a first bolometer 106 able to detect a part of an infrared radiation intended to be received by the detection device 100, and therefore thermally sensitive to this radiation. The first bolometer 106 comprises a first terminal electrically connected to a first electrical supply potential VDET and a second terminal connected electrically to the source of a first MOS transistor 108, here of the PMOS type, forming an injection transistor with regards to the first bolometer 106.

The pixels of the matrix 102 are here arranged in lines and columns in order to form a rectangular matrix of pixels.

Figure 1:
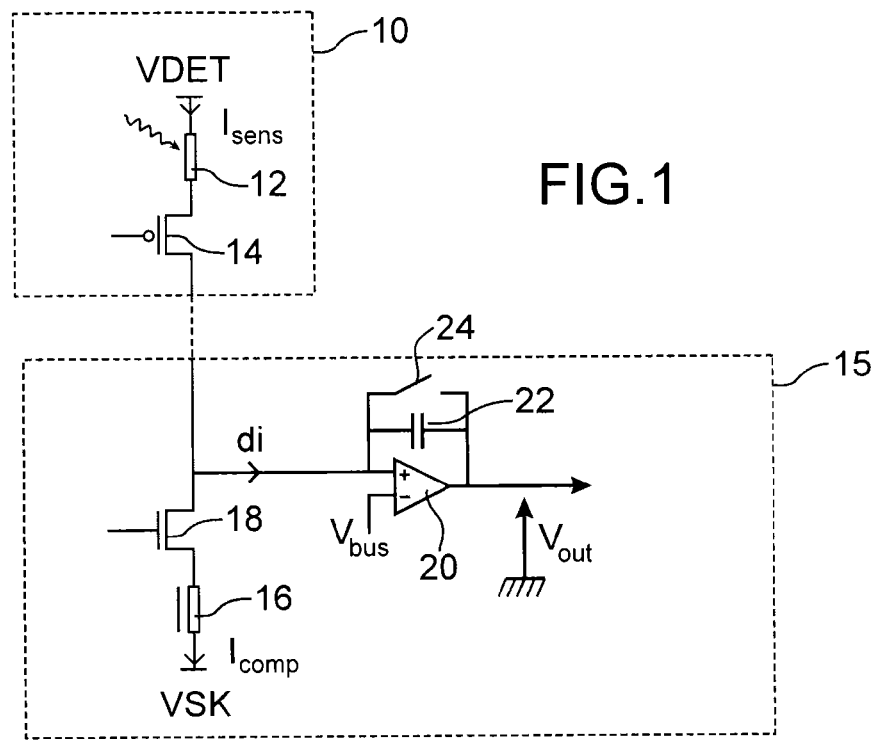
FIG. 1 shows a part of a bolometric infrared detection device according to prior art.

Each column of pixels of the matrix 102 is connected to a reading and compensation circuit 110 which makes it possible to carry out the reading of the signals outputted by the pixels of the column that it is associated with and a thermal compensation of these signals via at least one compensation bolometer integrated into this circuit 110. Only the part of the circuit 110 to which is connected the column of pixels to which belongs the pixel 104 is shown in FIG. 1 and described hereinbelow.

In the first embodiment described here, the reading and compensation circuit 110 comprises all of the elements of the reading and compensation circuit described hereinabove in liaison with FIG. 1, i.e. a second bolometer 112 forming a compensation bolometer, a second injection MOS transistor 114, here of the NMOS type, of which the source is connected to a first terminal of the second bolometer 112, a first operational amplifier 116 mounted as an integrator and of which the non-inverting input is connected to the drain of the second MOS transistor 114 and of which the output is looped back on its non-inverting input via an integration capacitor 118 coupled in parallel to a switch 120. An electrical bias potential $V_{bus}$ is applied on an inverting input of the first amplifier 116, and a second electric supply potential VSK is applied to a second terminal of the second bolometer 112.

The pixels of the column to which the pixel 104 belong to are connected sequentially (line by line) to the second compensation bolometer 112 as the sequential reading takes place of the lines of pixels of the matrix 102, for example via switches (not shown in FIG. 2) controlled by addressing signals.

The reading and compensation circuit 110 further comprises a second operational amplifier 122 mounted as a voltage follower (comprising its output looped back directly on its inverting input) and of which the non-inverting input is connected to the source of the first MOS transistor 108 via a switch 109, and therefore also to the second terminal of the first sensitive bolometer 106. The switch 109 is controlled synchronously with the addressing control making it possible to connect the pixel 104 to the second compensation bolometer 112. A multiplexor 124 makes it possible to connect an output 126 of the reading circuit 110, whereon a video amplifier is for example intended to be connected, either to the output of the first operational amplifier 116 or to the output of the second operational amplifier 122.

The second operational amplifier 122 makes it possible to directly read an electric potential $V_S$ at the second terminal of the first bolometer 106, and therefore to read a voltage at the terminals of the first bolometer 106. The multiplexor 124 makes it possible to select the information intended to be read at the output 126: either an output voltage $V_{out}$ of the first operational amplifier 116, corresponding to the information outputted by the pixel of the column which is read, or the electric potential Vs.

The source of the first MOS transistor 108 is not disturbed during the change in the position of the multiplexor 124 as regardless of this position, the source of the first MOS transistor 108 physically has high impedance thanks to the presence of the second operational amplifier 122 or to the opening of the switch 109.

In order to measure the electrical resistance $R_{sens}$ of the first sensitive bolometer 106 and/or the current $I_{sens}$ passing through the first sensitive bolometer 106, the following protocol is applied:

The first MOS transistor 108 and the second MOS transistor 114 are first of all polarized such that the first MOS transistor 108 is in a resistance regime and that the second MOS transistor 114 is in the blocked state. The bolometric bridge is as such blocked on one side. The multiplexor 124 is configured such that the output 126 is electrically connected to the output of the first amplifier 116. An integration, during a duration T, of the current $I_{sens}$ passing through the first bolometer 106 (as well as the first MOS transistor 108 in a resistance regime), by the first amplifier 116 and the capacitor 118 (capacitor of value C), is then carried out. During this integration, the switch 120 is open during this duration T. The voltage $V_{out}$ on the output 126 is then measured at the end of the duration T. The multiplexor 124 is then configured such that the output 126 of the circuit 110 is electrically connected to the output of the second operational amplifier 122. The switch 109 then in closed position, a first electric potential $V_{S1}$ at the second terminal of the first bolometer 106 is measured.

Knowing the voltage at the terminals of the first sensitive bolometer 106 (via the measurement of $V_{S1}$ and from the knowledge of the electric potential VDET) and the current flowing in the sensitive branch (via the voltage $V_{out}$ measured), the electrical resistance $R_{sens}$ of the first sensitive bolometer 106 is deduced:

$$R_{sens} = \frac{VDET - V_{S1}}{I_{sens}} = \left| \frac{VDET - V_{S1}}{(V_{out} - V_{bus}) \times \frac{C}{T}} \right| \quad (3)$$

The value of the electrical resistance $R_{sens}$ is here determined without approximation due to the fact in particular that the parasite resistance of the injection MOS transistor is overcome.

The operation of the device 100 is then switched to imaging mode. The bolometric bridge will then be balanced. In this mode, the exact knowledge of the current flowing in the active bolometers is an advantage both for adjusting the detector in its best performing configuration, and for supplying the digital simulation models with reliable experimental data.

In order to obtain the value of the current $I_{sens}$ which is characteristic of the global performance of the device 100, the first MOS transistor 108 and the second MOS transistor 114 are polarized (via the application of bias voltages on the gates of these two transistors) such that a current $I_{sens}$ passing through the first bolometer 106 is equal to the current $I_{comp}$ passing through the second bolometer 112, as such balancing the bolometric bridge. The multiplexor 124 is configured such that the output 126 of the circuit 110 is electrically connected to the output of the second operational amplifier 122. The electric potential $V_S$ is then measured again in these new conditions of polarization at the second terminal of the first bolometer 106, with this potential being called second electric potential $V_{S2}$ and corresponding to that obtained at the output 126.

In order to know the current $I_{sens}$ passing through the first sensitive bolometer 106, the new measurement of Vs taken previously and the previous calculation of the electrical resistance $R_{sens}$ of the first sensitive bolometer 106, make it possible to retrieve the value of this current:

$$I_{sens} = \frac{VDET - V_{S2}}{R_{sens}} \quad (4)$$

The reading and compensation circuit 110 comprises similar means for each column of pixels of the matrix 104, and therefore comprises means, or circuits, for reading a voltage at the terminals of each of the sensitive bolometers of the circuit 110, which makes it possible to calculate the electrical resistance of each sensitive bolometer of the circuit 110 as well as the current circulating in each sensitive bolometer of the device 100.

A conventional reading of the infrared radiation detected by the pixel 104 is carried out by configuring the multiplexor 124 such that the output 126 is electrically connected to the output of the first amplifier 116, and by leaving the switch 120 open such that the current di is integrated into the capacitor 118 and that the voltage $V_{out}$ read at the output 126 corresponds to the information captured by the pixel 104. The switch 120 is then closed in order to reinitialise the capacitor 118, emptying the electric charges stored in the capacitor 118, then put back to open position during the reading of another pixel of the column to which the pixel 104 belongs.

According to an alternative of this first embodiment, the infrared detection device 100 can also be carried out such that it makes it possible to measure the electrical resistance $R_{comp}$ of the second compensation bolometer 112 and possibly the current $I_{comp}$ passing through the second compensation bolometer 112. According to this alternative, during the measurement of the electrical resistance $R_{comp}$ or of the current $I_{comp}$, the non-inverting input of the second operational amplifier 122 is not electrically connected to the second terminal of the first bolometer 106 via the switch 109, but is connected to the first terminal of the second compensation bolometer 112.

In order to measure the electrical resistance $R_{comp}$ of the second compensation bolometer 112 and/or the current $I_{comp}$ passing through the second compensation bolometer 112, the following protocol is applied:

The first MOS transistor 108 and the second MOS transistor 114 are first of all polarized such that the second MOS transistor 114 is in a resistance regime and that the first MOS transistor 108 is in the blocked state. The bolometric bridge is as such blocked on one side. The multiplexor 124 is configured such that the output 126 is electrically connected to the output of the first amplifier 116. An integration, during a duration T, of the current $I_{comp}$ passing through the second bolometer 112 (as well as the second MOS transistor 114 in a resistance regime), by the first amplifier 116 and the capacitor 118 (capacitor of value C), is then carried out. During this integration, the switch 120 is open. The voltage $V_{out}$ on the output 126 is then measured at the end of the duration T. The multiplexor 124 is then configured such that the output 126 of the circuit 110 is electrically connected to the output of the second operational amplifier 122. A first electric potential $V_{S1'}$ at the first terminal of the second bolometer 112 is then measured.

Knowing the voltage at the terminals of the second bolometer 112 (via the measurement of $V_{S1'}$ and the knowledge of the electric potential VSK) and the current flowing in the compensation branch (via the voltage $V_{out}$ measured), the electrical resistance $R_{comp}$ of the second compensation bolometer 112 is deduced:

$$R_{comp} = \left| \frac{V_{SV} - VSK}{(V_{out} - V_{bus}) \times \frac{C}{T}} \right| \quad (5)$$

As described previously, the operation of the device 100 is then switched to imaging mode. The bolometric bridge will then be balanced. In order to obtain the value of the current $I_{comp}$ which is also characteristic of the global performance of the detector, the first MOS transistor 108 and the second MOS transistor 114 (via the application of bias voltages on the gates of these two transistors) are polarized such as a current $I_{sens}$ passing through the first bolometer 106 is equal to the current $I_{comp}$ passing through the second bolometer 112, as such balancing the bolometric bridge. The multiplexor 124 is configured such that the output 126 of the circuit 110 is electrically connected to the output of the second operational amplifier 122. The electric potential $V_S$ is then measured again in these new conditions of polarization at the first terminal of the second bolometer 112, with this potential being called second electric potential $V_{S2'}$ and corresponding to that obtained at the output 126.

In order to know the current $I_{comp}$ passing through the second bolometer 112, the new measurement of Vs taken previously and the previous calculation of the electrical resistance $R_{comp}$ of the second bolometer 112, make it possible to retrieve the value of this current:

$$I_{comp} = \frac{V_{S2'} - VSK}{R_{comp}} \quad (6)$$

Figure 3:
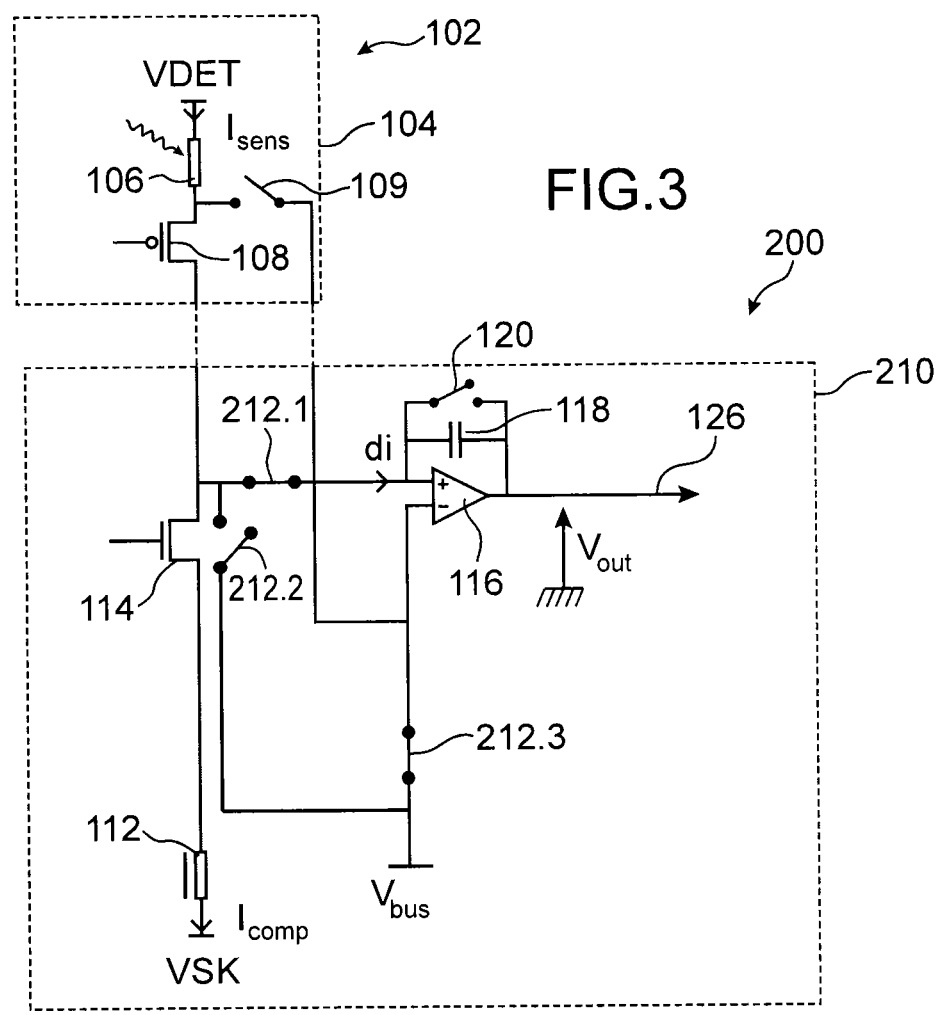

In liaison with FIG. 3 an infrared detection device 200 shall now be described according to a second embodiment.

The detection device 200 comprises a pixel array 102 similar to that of the detection device 100. The device 200 further comprises a reading and compensation circuit 210 comprising, like the reading circuit 110 described previously, for each pixel, the first sensitive bolometer 106, the first MOS transistor 108, the first amplifier 116 coupled to the capacitor 118 and to the switch 120.

Contrary to the circuit 110 of which the means, or circuits, for reading the tension at the terminals of the first sensitive bolometer 106 and/or of the voltage at the terminals of the second compensation bolometer 112 (which implies in this case, in place of the electrical connection between the non-inverting input of the first amplifier 116 and the second terminal of the first bolometer 106, an electrical connection between the non-inverting input of the first amplifier 116 and the first terminal of the second bolometer 112) comprise the second operational amplifier 122 mounted as a voltage follower, the reading of this tension (of the potential $V_S$) is carried out by the first amplifier 116. For this, the reading and compensation circuit 210 comprises several switches, referenced as 212.1 to 212.3, which, in a first configuration, electrically connect the non-inverting input of the first amplifier 116 to the drain of the first MOS transistor 108 and electrically connect the inverting input of the first amplifier 116 to the electrical bias potential $V_{bus}$. In this first configuration, the first amplifier 116 is mounted as an integrator and makes it possible to carry out the integration of the current di, as described previously for the detection device 100. In this first configuration, which can be seen in FIG. 3, the first switch 212.1 and the third switch 212.3 are closed, while the second switch 212.2 and the switch 109 in the pixel 104 are open.

In a second configuration, the open or closed states of the switches 212.1 to 212.3 and 109 are inverted with respect to those of the first configuration. In the example described here, the first switch 212.1 and the third switch 212.3 are then open, while the second switch 212.2 and the switch 109 are closed. In addition, in this second configuration, the switch 120 which is used, during the reading of pixels, to reinitialise the capacitor 118, is here closed. As such, in this second configuration, the output of the first amplifier 116 is looped back directly on the non-inverting input of the first amplifier 116 and no signal other than the output signal is applied on this non-inverting input. The first amplifier 116 is therefore mounted as a voltage follower, and makes it possible to re-transcribe on its output the electric potential applied to its non-inverting input. Due to the fact that the fourth switch 109 is closed and that the third switch 212.3 is open, the electric potential $V_S$ is therefore applied to the inverting input of the first amplifier 116. In this second configuration, it is therefore the first amplifier 116 that makes it possible to read the voltage at the terminals of the first sensitive bolometer 106 and/or at the terminals of the second compensation bolometer 112. In addition, due to the fact that in this second configuration the second switch 212.2 is closed, the electrical bias potential $V_{bus}$ is applied to the drain of the first MOS transistor 108 and to the drain of the second MOS transistor 114, which makes it possible to prevent these electrodes of the MOS transistors 108 and 114 from being in the air and from having the same polarization conditions than in the first configuration.

In this reading and compensation circuit 210, the output 126 is always connected to the output of the first amplifier 116 due to the fact that the first amplifier 116 is used for both carrying out the integrating of the current outputted by the bolometers (the amplifier 116 is then mounted as an integrator) and reading the voltage at the terminals of the first sensitive bolometer 106 and/or at the terminals of the second compensation bolometer 112 (the amplifier 116 is then mounted as a voltage follower) according to the configuration wherein the switches 212.1 to 212.3 and 109 are. These switches 212.1 to 212.3 and 109 are for example formed by 4 MOS transistors placing in the passing state or in the blocked state according to the configuration considered.

Figure 4:
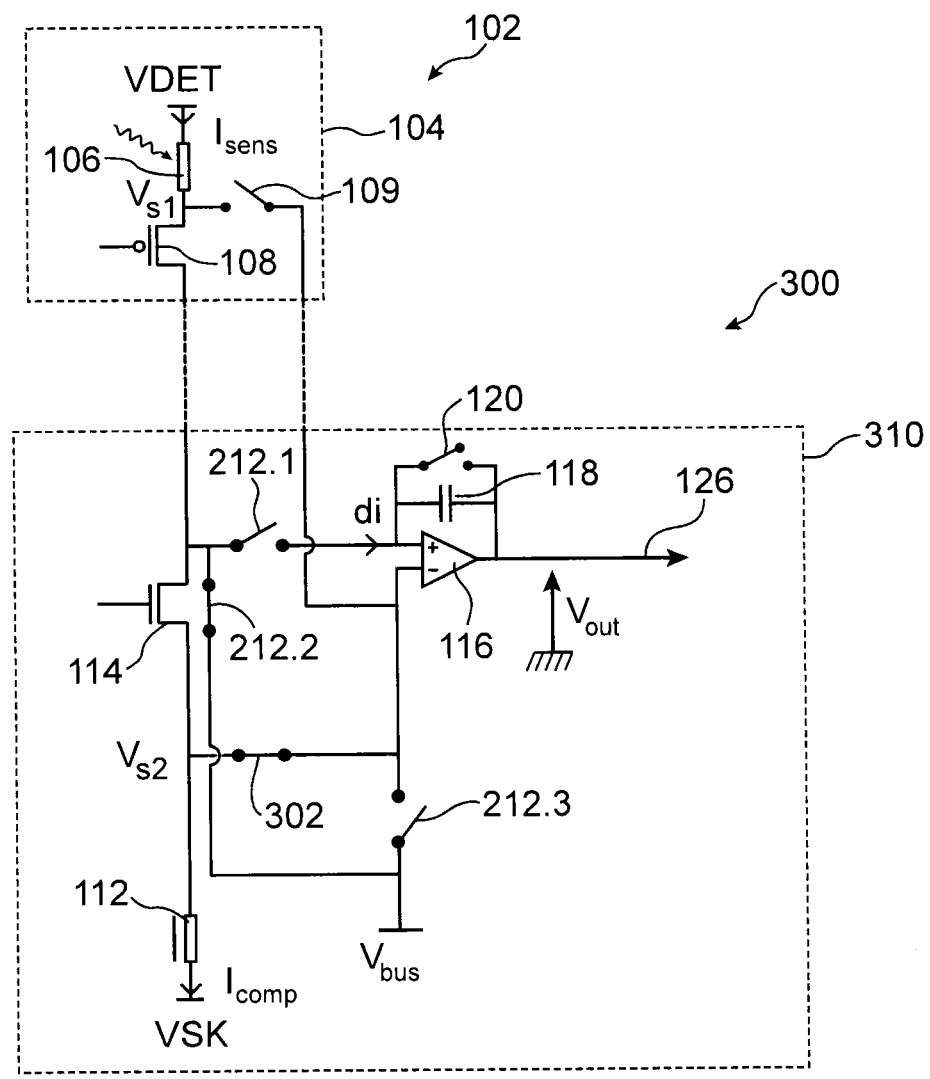

In liaison with FIG. 4 an infrared detection device 300 shall now be described according to a third embodiment.

The operation of the detection device 300 is here similar to that of the detection device 200 described previously. As such, in the detection device 300 described here, the reading of the voltage at the terminals of the first sensitive bolometer 106 is carried out by the first amplifier 116 and the four switches 212.1 to 212.3 and 109 when the latter are in their second configuration as described previously for the detection device 200, with the first amplifier 116 being in this case mounted as a follower of the voltage $V_{S1}$ on the second terminal of the first bolometer 106 (with the switch 120 in closed position). When the four switches 212.1 to 212.3 and 109 are in their first configuration, the first amplifier 116 is then mounted as an integrator and makes it possible to integrate the current arriving on its non-inverting input. In this first configuration, the switch 120 is open.

The detection device 300 further comprises another switch 302 making it possible to connect or not connect the first terminal of the second compensation bolometer 112 to the non-inverting input of the first amplifier 116. In the first and the second configuration of the switches 212.1 to 212.3 and 109, the switch 302 is in open position. In a third configuration separated from the other two configurations, the switches 212.1, 109 and 212.3 are in open position and the switches 212.2, 120 and 302 are in closed position (case shown in FIG. 4). As such, in this third configuration, the first amplifier 116 is then mounted as a voltage follower and makes it possible to read the voltage at the terminals of the second compensation bolometer 112, with the electric potential $V_{S2}$ at the first terminal of the second compensation bolometer 112 being obtained at the output 126. As such, it is possible to measure the electrical resistance of the second compensation bolometer 112 and also estimate the current flowing in the second compensation bolometer 112, by implementing steps similar to those described hereinabove in liaison with the alternatives of the preceding embodiments of the detection device 100 and 200, but with the switches 212.1 to 212.3, 109 and 302 in their third configuration.

For this, the first MOS transistor 108 and the second MOS transistor 114 are polarized such that the first MOS transistor 108 is in the blocked state and that the second MOS transistor 114 is in a resistance regime, then an integration is carried out, during a time T, of the current passing through the second compensation bolometer 112 in the capacitor 118. The output voltage $V_{out}$ of the first operational amplifier 116 is then measured.

A measurement of the electric potential $V_{S2}$ is then carried out on the first terminal of the second bolometer 112 by switching the switches 212.1-212.3, 109 and 302 in the third configuration. The electrical resistance $R_{comp}$ of the second bolometer 112 is then calculated such that:

$$R_{comp} = \left| \frac{VSK - V_{S2}}{(V_{out} - V_{bus}) \times \frac{C}{T}} \right| \tag{7}$$

Then, the first MOS transistor 108 and the second MOS transistor 114 are polarized such that a current passing through the first bolometer 106 is substantially equal to the current passing through the second bolometer 112.

In these conditions of polarization (balanced bolometric bridge), a measurement of the electric potential $V_{S2'}$ is then carried out by switching the switches 212.1-212.3, 109 and 302 in the third configuration. It is then possible to calculate the current $I_{comp}$ passing through the second bolometer 112 such that:

$$I_{comp} = \frac{V_{S2'} - VSK}{R_{comp}} \tag{8}$$

As an alternative of the detection device 300, it is possible that the means, or the circuit, for reading the tension at the terminals of the second bolometer 112 comprise the second operational amplifier 122 and the multiplexor 124 as a replacement of switches 212.1 to 212.3 and 109.

In addition, when the detection device comprises the second operational amplifier 122 mounted as a follower, it is also possible to add the switch 302 as well as another switch between the non-inverting input of the second operational amplifier 122 and the first terminal of the second bolometer 112. As such, according to the configuration of these two switches, the second operational amplifier can be used to read the voltage at the terminals of the first bolometer 106 or of the second bolometer 112.

The second and third embodiments previously described can alternatively be carried out such that the reading and compensation circuits 210 and 310 are directly integrated in the pixels.

In all of the embodiments and alternatives considered, it is possible to carry out a control of the bias voltages applied to the gates of the MOS transistors 108 and 114 according to the current flowing in the bolometers. Such a control then makes it possible to find the optimum polarization point of the detection device and therefore to formally optimise the performance/consumption pair for each detector, which is advantageous in particular during a change in the technology for carrying out the detection device (new CMOS foundry or new pixel design for example).

In all of the embodiments and alternatives described previously, it is possible for the substrate whereon the detection device is carried out to be regulated thermally.

According to an alternative of the various embodiments described hereinabove, it is possible to have a reference bolometer arranged at the head of each line of the pixel array in place of the compensation bolometer arranged at the column foot. In this case, via a set of current mirrors, the current flowing in the reference bolometer is copied and subtracted from the currents coming from the sensitive bolometers. The various means or circuits described previously can in this case be used to measure the electrical resistance of the sensitive bolometers and the current passing through the sensitive bolometers.

The invention claimed is:

1. An infrared detection device comprising:
at least one first bolometer configured to detect at least a part of infrared radiation received by the infrared detection device; and
a reading and compensation circuit configured to operate on a first electrical signal outputted by the first bolometer, the reading and compensation circuit including:
one second bolometer coupled electrically to the first bolometer and insensitive to the infrared radiation received by the infrared detection device,
one first reading circuit configured to read said first electrical signal from which is subtracted a second electrical signal outputted by the second bolometer, and
one second reading circuit configured to read at least one of an electrical voltage at terminals of the at least one first bolometer or an electrical voltage at terminals of the second bolometer,
wherein the first reading circuit includes at least one first operational amplifier configured to carry out an integration of a first current that passes through the first bolometer, corresponding to the first electrical signal, and from which is subtracted a second current, corresponding to the second electrical signal, that passes through the second bolometer, and
wherein the second reading circuit includes a plurality of switches configured to electrically connect, in a first configuration, a first input of the first operational amplifier to an electrical connection that connects the first bolometer to the second bolometer, and to electrically connect, in a second configuration, a second input of the first operational amplifier to one of the terminals of the first bolometer via one of the switches located in a pixel of the infrared detection device, the pixel including the first bolometer, and/or to one of the terminals of the second bolometer, and such that the first operational amplifier is mounted as an integrator in the first configuration and as a voltage follower in the second configuration.

2. The infrared detection device according to claim 1, wherein the switches are configured to electrically connect, in the first configuration, the second input of the first operational amplifier to an electrical bias potential, and to electrically connect, in the second configuration, said electrical connection to the electrical bias potential.

3. The infrared detection device according to claim 1, comprising:

a pixel array such that each pixel includes at least one first bolometer configured to detect a part of the infrared radiation received by the infrared detection device,
wherein each line or each column of pixels of the pixel array is coupled electrically to a reading and compensation circuit including:
one second bolometer electrically coupled to the first bolometers of said line or column of pixels and insensitive to the infrared radiation received by the infrared detection device,
one first reading circuit configured to read first electrical signals outputted by the first bolometers of said line or column of pixels from which is subtracted a second electrical signal outputted by the second bolometer, and
one second reading circuit configured to read an electrical voltage at terminals of the first bolometer via a switch located in a corresponding pixel and/or an electrical voltage at terminals of the second bolometer.

4. The infrared detection device according to claim 3, wherein the second reading circuit is configured to read the electrical voltage at the terminals of the first bolometer via the switch located in the corresponding pixel and able to read the electrical voltage at the terminals of the second bolometer via a second switch located in the reading and compensation circuit.

5. The infrared detection device according to claim 1, wherein:
the first bolometer includes a first terminal connected electrically to a first electrical supply potential, and a second terminal connected electrically to a source of a first MOS transistor;
the second bolometer includes a first terminal connected electrically to a first electrode of a second MOS transistor corresponding to a source of the second MOS transistor, and a second terminal connected electrically to a second electrical supply potential;
an input of the first reading circuit is connected electrically to a second electrode of the second MOS transistor corresponding to a drain of the second MOS transistor; and
an input of the second reading circuit is connected electrically to the second terminal of the first bolometer via a switch located in the pixel and/or to the first terminal of the second bolometer.

6. An infrared detection method implemented using an infrared detection device according to claim 5, comprising:
polarizing the first MOS transistor and the second MOS transistor such that the first MOS transistor is in a resistance regime and that the second MOS transistor is in a blocked state, then
integrating, during a duration T, current passing through the first bolometer in a capacitor of value C coupled to the first operational amplifier, then
measuring an output voltage $V_{out}$ of the first operational amplifier, then
measuring, by the second reading circuit, a first electric potential $V_{S1}$ at the second terminal of the first bolometer, then
calculating an electrical resistance $R_{sens}$ of the first bolometer such that:

$$R_{sens} = \left| \frac{VDET - V_{S1}}{(V_{out} - V_{bus}) \times \frac{C}{T}} \right|,$$

with VDET: first electrical supply potential applied to the first terminal of the first bolometer;

$V_{bus}$: electrical bias potential applied on an input of the first operational amplifier; and/or comprising:

polarizing the first MOS transistor and the second MOS transistor such that the first MOS transistor is in a blocked state and that the second MOS transistor is in a resistance regime, then integrating, during a duration T, current passing through the second bolometer in the capacitor of value C coupled to the first operational amplifier, then measuring an output voltage $V_{out}$ of the first operational amplifier, then measuring, by the second reading circuit, a first electric potential $V_{S1}$, at the first terminal of the second bolometer, then calculating an electrical resistance $R_{comp}$ of the second bolometer such that:

$$R_{comp} = \left| \frac{V_{SV} - VSK}{(V_{out} - V_{bus}) \times \frac{C}{T}} \right|,$$

with VSK: second electric supply potential applied on the second terminal of the second bolometer.

7. Infrared detection method according to claim 6, further comprising, in the calculating of the electrical resistance $R_{sens}$:

polarizing the first MOS transistor and the second MOS transistor such that a current passing through the first bolometer is substantially equal to a current passing through the second bolometer, then measuring, by the second reading circuit, a second electric potential $V_{S2}$ at the second terminal of the first bolometer, then calculating a current $I_{sens}$ passing through the first bolometer such that:

$$I_{sens} = \frac{VDET - V_{S2}}{R_{sens}},$$

and/or further comprises, in the calculating of the electrical resistance $R_{comp}$:

polarizing the first MOS transistor and the second MOS transistor such that a current passing through the first bolometer is substantially equal to a current passing through the second bolometer, then measuring, by the second reading circuit, a second electric potential $V_{S2}$, at the first terminal of the second bolometer, then calculating a current $I_{comp}$ passing through the second bolometer such that:

$$I_{comp} = \frac{V_{S2'} - VSK}{R_{comp}}.$$

* * * * *